United States Patent
Fukushima

(10) Patent No.: US 6,852,927 B2
(45) Date of Patent: Feb. 8, 2005

(54) THIN METAL PACKAGE AND MANUFACTURING METHOD THEREOF

(75) Inventor: Daisuke Fukushima, Shiga (JP)

(73) Assignee: NEC Schott Components Corporation, Minakuchi-cho (JP)

( * ) Notice: Subject to any disclaimer, the term of this patent is extended or adjusted under 35 U.S.C. 154(b) by 0 days.

(21) Appl. No.: 10/490,876

(22) PCT Filed: Oct. 17, 2002

(86) PCT No.: PCT/JP02/10808

§ 371 (c)(1),
(2), (4) Date: Mar. 26, 2004

(87) PCT Pub. No.: WO03/034486

PCT Pub. Date: Apr. 24, 2003

(65) Prior Publication Data

US 2004/0206535 A1 Oct. 21, 2004

(30) Foreign Application Priority Data

Oct. 18, 2001 (JP) .................................. 2001-320095

(51) Int. Cl.[7] ............................................. H01L 23/02
(52) U.S. Cl. ...................... 174/52.4; 174/52.3; 257/698
(58) Field of Search ............................. 174/52.3, 52.4, 174/52.5; 257/698

(56) References Cited

U.S. PATENT DOCUMENTS

| 3,381,372 | A | * | 5/1968 | Capano | 29/827 |
|---|---|---|---|---|---|
| 4,167,647 | A | * | 9/1979 | Salera | 174/52.4 |
| 4,382,327 | A | * | 5/1983 | Bardens et al. | 29/832 |
| 5,103,292 | A | | 4/1992 | Mahulikar | |
| 5,247,134 | A | * | 9/1993 | Beltz | 174/52.4 |
| 6,091,022 | A | * | 7/2000 | Bodin | 174/52.5 |

FOREIGN PATENT DOCUMENTS

| JP | 10032453 | 2/1998 |
|---|---|---|
| JP | 2000278074 | 10/2000 |
| JP | 2000286661 | 10/2000 |
| JP | 2001211050 | 8/2001 |

* cited by examiner

*Primary Examiner*—Hung V. Ngo
(74) *Attorney, Agent, or Firm*—W. F. Fasse; W. G. Fasse

(57) ABSTRACT

A surface mounting package includes a metal base with a lower surface having a through hole, a metal lead arranged to be inserted into the through hole, an insulating material arranged at an internal space of the metal base, a cap covering the metal base as a lid, and an electronic part component arranged at a surface of the metal lead that is positioned at the internal space of the metal base. The internal space is held at an air-tight atmosphere. The metal lead forms a surface for attaching the metal base to a mounting board. An insulation distance between the metal lead and the metal base is at least 0.05 mm and at most 0.3 mm.

4 Claims, 8 Drawing Sheets

THIN METAL PACKAGE AND MANUFACTURING METHOD THEREOF

TECHNICAL FIELD

The present invention relates to a surface mounting package for an electronic part, and to a technique of adhering a metal base and a metal lead together by an insulating material.

BACKGROUND ART

Surface mounting devices such as a quartz resonator, a filter or an oscillator for surface mounting, as electronic parts, each has a structure in that a surface mounting package to be a housing contains a piece of quartz, a piezoelectric device or the like. Examples of such surface mounting packages typically include four types of structures each having a base and a cap, as will be described below as Conventional Examples 1 to 4.

CONVENTIONAL EXAMPLE 1

A surface mounting package of Conventional Example 1 is formed, as shown in FIGS. 16 and 18, by first adhering a metal lead 51 for lead-out to a metal base 50 by high-melting glass 52 which is an insulating adhesive (e.g. borosilicate), and then combining therewith a cylindrical cap 53 shown in FIG. 17 such that an opening end 54 is coupled around metal base 50 for cutting off (sealing) the assembly from the outside. As can be seen from FIG. 19, cylindrical cap 53 has a leg 55 for holding its position, connected by welding or the like to an outer periphery of the cylindrical portion. Cylindrical cap 53 in such a package is made of metal for preventing entry of external electromagnetic wave that interferes with the function of a quartz resonator and the like.

CONVENTIONAL EXAMPLE 2

A surface mounting package of Conventional Example 2 is shown in FIG. 20. The package is formed by combining a box-shaped ceramic base 56 with a platy ceramic cap 57. Only an insulator is used as a material for the package. If there is no concern about entry of electromagnetic wave, the package may be made of an insulator alone as in Conventional Example 2, not using a metal material as in Conventional Example 1.

CONVENTIONAL EXAMPLE 3

A surface mounting package of Conventional Example 3 is shown in FIG. 21. The package is formed by combining ceramic base 58 and a translucent glass cap 60 that serves as a top plate to cover a ceramic base opening 59, and sealing the package with low-melting glass 61. The package uses a glass cap, so that oscillation frequency after sealing can easily be adjusted by laser trimming.

CONVENTIONAL EXAMPLE 4

A surface mounting package of Conventional Example 4 is shown in FIG. 22. The package is formed by combining a ceramic base 62 with a metal cap 63. A metal thin film 65 (e.g. silver brazing filler metal) is formed on an upper surface at the opening side of a spacer 64 forming sidewalls of ceramic base 62. Metal thin film 65 and metal cap 63 are connected together by seam welding or electron-beam welding.

The surface mounting package according to Conventional Example 1, however, needs to ensure insulation between metal lead 51 and metal base 50 by providing insulating material 52 around metal lead 51, which increases the outer diameter of the package by a distance required for insulation, and thus adversely affects thinning of the package. As for the techniques other than that of Conventional Example 1, each of the surface mounting packages according to Conventional Examples 2 to 4 uses a ceramic material, so that it is difficult to reduce cost, due to increase in the cost of processing and material of the package.

DISCLOSURE OF THE INVENTION

In view of the conventional circumstances as described above, it is an object of the present invention to provide a surface mounting package that allows further reduction in the thickness.

To achieve the object, a surface mounting package according to the present invention employs a metal base in place of the combination of an insulating ceramic base and a cap. A metal lead for lead-out is provided at the bottom of the metal base having a surface to be attached to a mounting board. The metal lead has a shape of a flat plate. The metal lead forms the surface to be attached to the mounting board. The base is made of metal, which facilitates processing and ensures a certain package strength. By filling the lower part of the inside of the metal base with an insulating material, it is easy to form a structure having a plurality of metal leads. Thus, a thin metal package can easily be obtained by employing a lead frame.

The present invention is to provide a metal package in which a metal lead is inserted into a through hole at a metal base having the through hole at the bottom surface thereof to form an attaching surface of the metal base by the metal lead, while a part of an inner space of the metal base is filled with an insulating material and an assembled base is formed by the metal base and a cap covering the metal base as a lid, the inner space being held at an air-tight atmosphere by an electronic part component installed or adhered onto a surface of the metal lead within the metal base.

In addition, according to the present invention, when the lower surface of the metal base corresponds to a surface to be attached to the board (board attaching surface), a sufficient insulation distance between the metal lead and the board attaching surface allows easy check-out of a solder fillet after the metal package is mounted to the board. Furthermore, according to the present invention, at manufacturing of the metal package, a plurality of metal leads may be formed as a lead frame plate, to be inserted into respective ones of a plurality of metal bases and coupled thereto by melting and solidifying the insulating material, and thereafter cut into individual thin metal packages.

BEST MODES FOR CARRYING OUT THE INVENTION

The present invention will clearly be understood by the following description of embodiments.

First Embodiment

Figure 1:
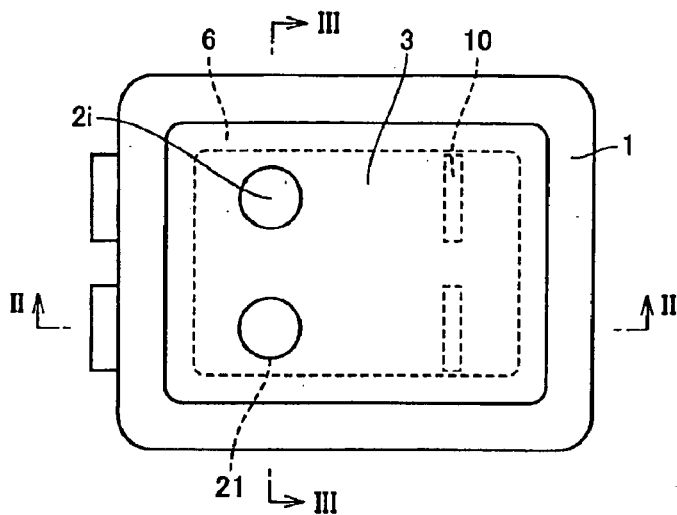
FIG. 1 is a plan view of a thin metal package of a surface mounting type according to the first embodiment of the present invention.
Figure 11:
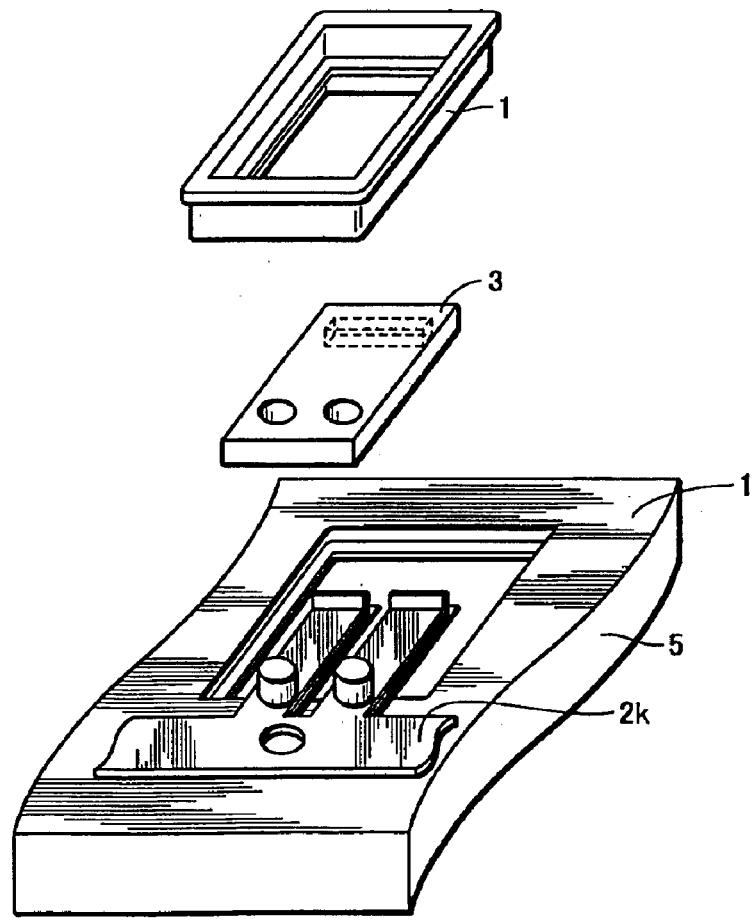
FIG. 11 illustrates a method of manufacturing a thin metal package of a surface mounting type in the second embodiment of the present invention.
Figure 13:
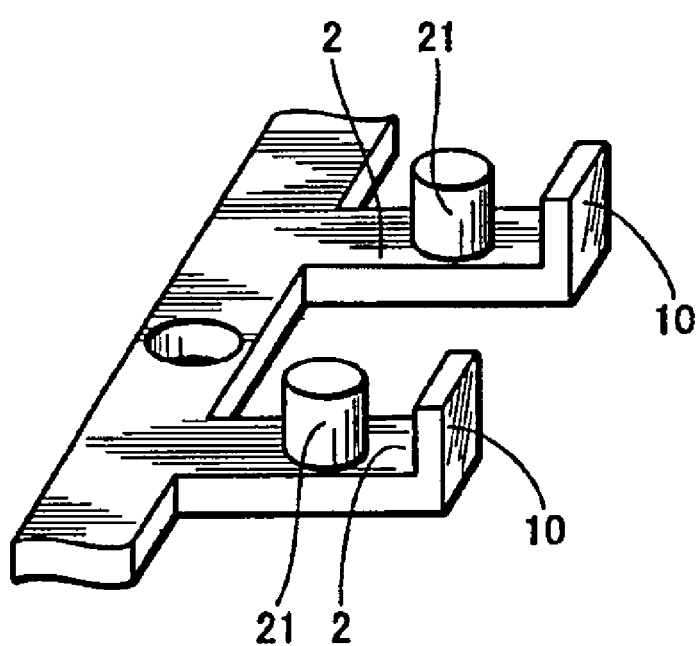
FIG. 13 is a perspective view showing an example of a metal lead applicable to the thin metal package of the surface mounting type in the first embodiment of the present invention.

A surface mounting package for quartz resonator according to the first embodiment of the present invention will be described with reference to FIG. 1. The surface mounting package for quartz resonator is a thin metal package of a surface mounting type, constituted by an assembled base 4 in which a metal base 1 and a metal lead 2 are adhered together by melting and solidifying an insulating material 3, and a metal cap Ca illustrated by a chain double-dashed line (see FIG. 2). Metal base 1 constituting assembled base 4 forms a metal frame structure (i.e. a box structure with a portion corresponding to the bottom surface opened) as shown in FIG. 11. A protrusion 6 is formed at the inner surface of metal base 1 such that it digs into insulating material 3 when metal base 1 is filled with insulating material 3. Protrusion 6 digs into insulating material 3 to secure a sufficiently large adhesion area, improving the strength in adhesion between insulating material 3 and metal base 1. As the adhesion strength is thus improved, the standard can be met for the body strength required for the package, the flexural strength of the board after mounting of the package and the like. Metal lead 2 is formed by a flat metal plate to which a cylinder 21 is connected, the cylinder 21 portion protruding toward the inside of insulating material 3 and digging therein, to ensure sufficient adhesion strength. In metal lead 2, an end surface 2i of cylinder 21 that is to be positioned within metal base 1 serves as an internal electrode, while an outer surface 2o exposed to a lower side of metal base 1 serves as an external electrode. When the quartz piece electrode to be mounted into metal base 1 is of a type that has two terminals arranged only on one side, i.e. a cantilever type, such a structure that two leads protrude from one side as metal leads 2 may be adopted, as shown in FIG. 13.

Figure 2:
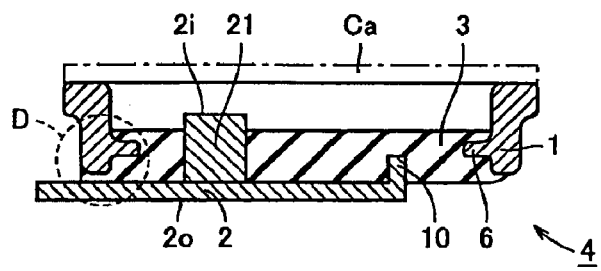
FIG. 2 is a section view taken along line II—II in FIG. 1 in the direction of the arrow.
Figure 3:
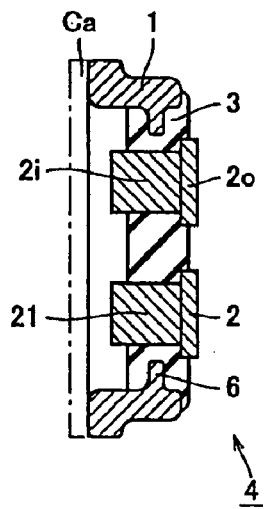
FIG. 3 is a section view taken along line III—III in FIG. 1 in the direction of the arrow.
Figure 4:
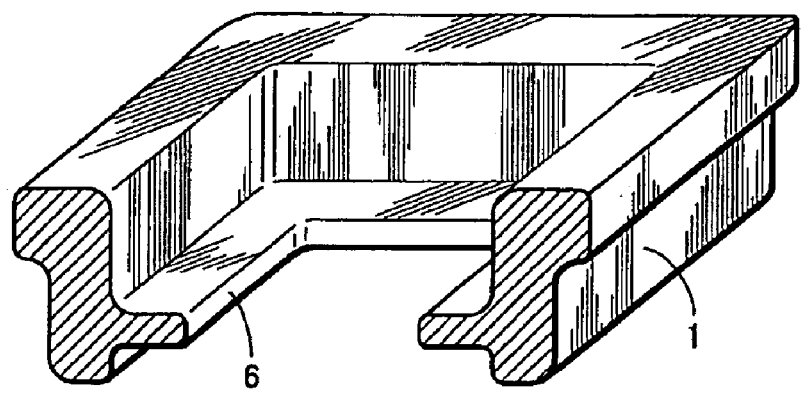
FIG. 4 is a perspective view of a metal base used in a thin metal package according to the present invention.
Figure 12:
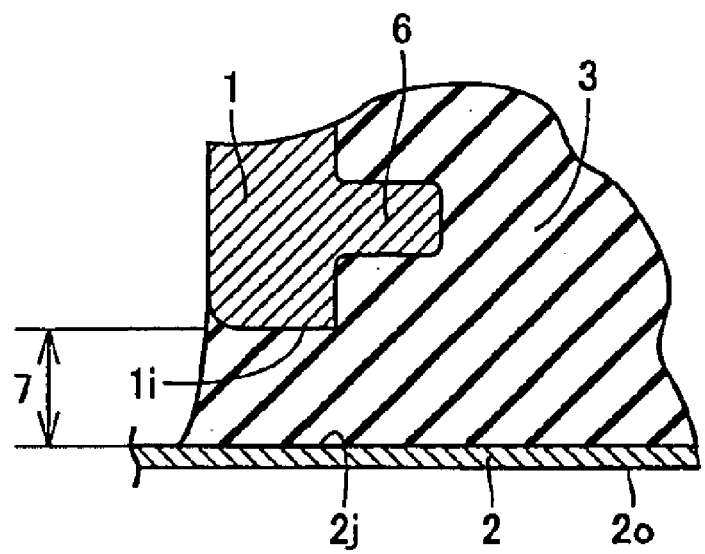
FIG. 12 is an enlarged section view of the vicinity of a gap between a metal base and a metal lead in a thin metal package according to the present invention.

Metal lead 2 and insulating material 3 of high-melting glass, e.g. borosilicate glass, in a tablet form, are arranged in metal base 1, and heat is applied to melt insulating material 3, allowing metal base 1 and metal lead 2 to be connected together, as shown in FIGS. 2 and 3. Here, protrusion 6 at the inner surface of metal base 1 and a hook portion 10 (see FIG. 13) formed by bending a tip portion of metal lead 2 are buried in insulating material 3. Moreover, as shown in FIG. 12, a part of insulating material 3 flows in a gap between a lower surface 1i of metal base 1 and a flat plate portion 2j of metal lead 2, allowing the height of insulating material 3 to be set in the range between 0.2 and 0.6 mm, resulting in successful setting of insulation distance 7 in the range between 0.05 and 0.3 mm. Thus, the external electrode can be lead out from the side surface of the metal base, allowing check-out of the shape of a solder fillet after attachment to the board.

It is noted that, though, in FIG. 12, a part of insulating material 3 flows through a gap opened between lower surface 1i of metal base 1 and flat plate portion 2j of metal lead 2 by insulation distance 7 as described above, insulation may also be provided by air instead of insulating material 3 flowing up to the gap portion between lower surface 1i and flat plate portion 2j of metal lead 2, and insulation distance 7 may be in the range between 0.05 and 0.3 mm as in the case above.

A quartz piece which is an electronic part component is fixed to a pair of metal leads 2 in assembled base 4 configured as described above. Metal base 1 is covered and coupled with metal cap Ca indicated by chain double-dashed lines in FIG. 2.

Manufacturing Method

Metal base 1 and metal lead 2 pretreated by acid cleaning or oxidation, and high-melting glass 3 press-formed from a powder form into a tablet form are inserted into a carbon jig 5 as shown in FIG. 11. Here, metal lead 2 is configured to be in a form of a lead frame from which a plurality of metal leads can be punched out so as to correspond to metal bases of respective metal packages, allowing easy insertion. In the procedure, as shown in FIG. 11, a lead frame 2k, glass tablet insulating material 3 and metal base 1 are sequentially arranged at respective positions in carbon jig 5, using an assembly assistant device. Another carbon jig for applying a load and for locating is mounted on carbon jig 5, and is placed in a high temperature furnace. Thus, an integrated product of the metal base, metal lead and glass insulating material are attached to the tip of the branch of each lead frame. While in such a state, the process then goes on to plating. In the plating process, a method called suspension plating is used. That is, the lead frame is suspended by a belt to be immersed in a plating tank. Such plating per lead frame can reduce the number of man-hours and increase a yield.

Second Embodiment

Figure 5:
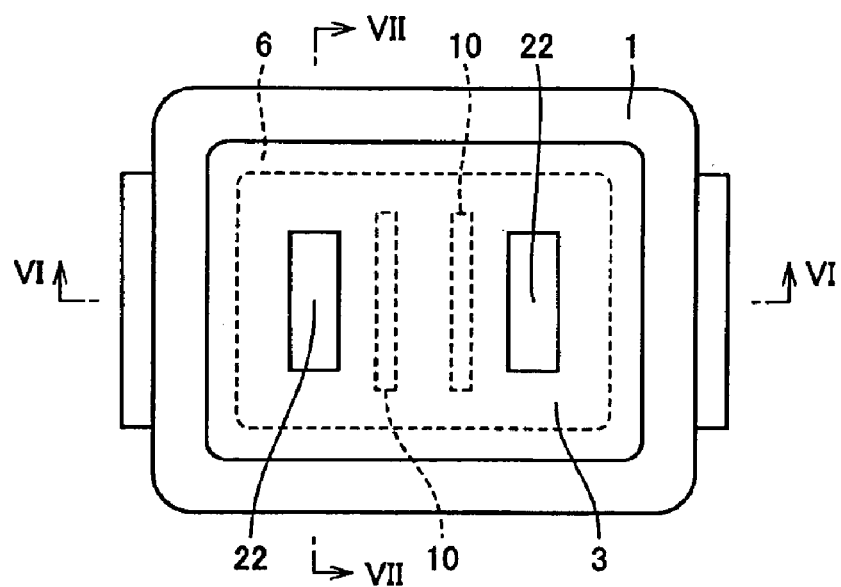
FIG. 5 is a plan view of a thin metal package of a surface mounting type according to the second embodiment of the present invention.
Figure 6:
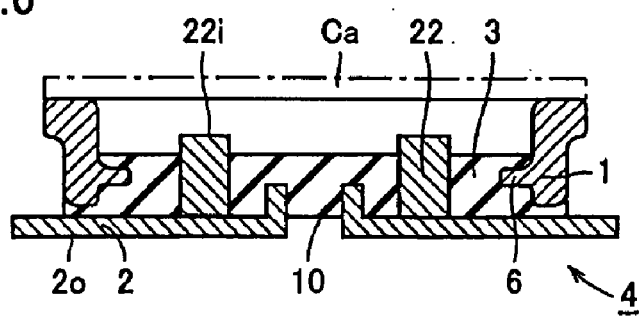
FIG. 6 is a section view taken along line VI—VI in FIG. 5 in the direction of the arrow.
Figure 7:
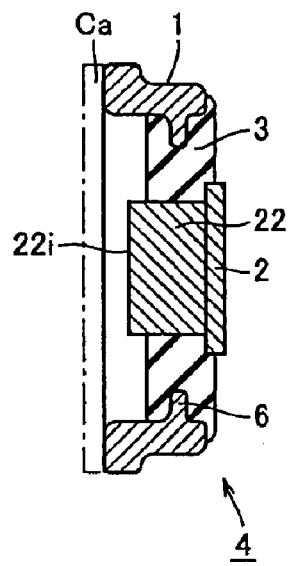
FIG. 7 is a section view taken along line VII—VII in FIG. 5 in the direction of the arrow.
Figure 14:
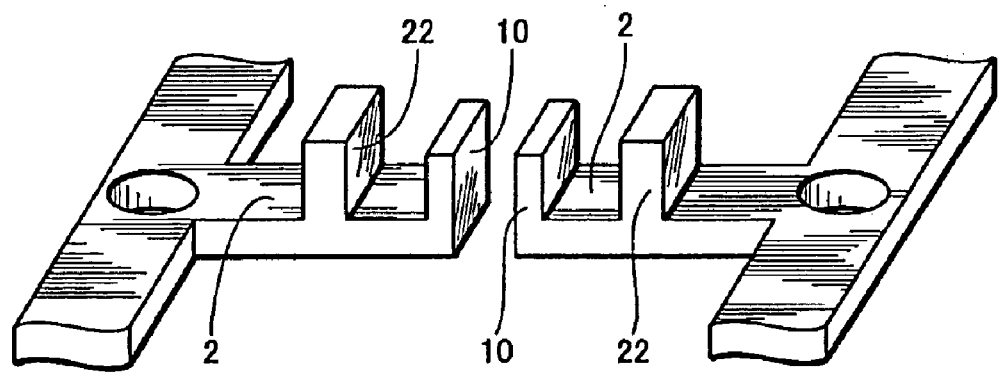
FIG. 14 is a perspective view showing an example of a metal lead applicable to the thin metal package of the surface mounting type in the second embodiment of the present invention.

A surface mounting package for quartz resonator according to the second embodiment of the present invention will be described with reference to FIGS. 5 to 7. The surface mounting package for quartz resonator is a thin metal package of a surface mounting type, constituted by an assembled base 4 in which metal base 1 and metal lead 2 are adhered together by melting and solidifying insulating material 3, and metal cap Ca illustrated by a chain double-dashed line (see FIG. 2). Metal base 1 constituting assembled base 4 forms a metal frame structure (i.e. a box structure with a portion corresponding to the bottom surface opened) as shown in FIG. 11. A protrusion 6 is formed at the inner surface of metal base 1 such that it digs into insulating material 3 when metal base 1 is filled with insulating material 3. Protrusion 6 digs into insulating material 3 to secure a sufficiently large adhesion area, improving the strength in adhesion between insulating material 3 and metal base 1. As the adhesion strength is thus improved, the standard can be met for the body strength required for the package, the flexural strength of the board after mounting of the package, and the like. Metal lead 2 is formed by a flat metal plate to which a quadrangular prism 22 is connected, the quadrangular prism 22 portion protruding toward the inside of insulating material 3 and digging therein, to ensure sufficient adhesion strength. In metal lead 2, an end surface 22i of quadrangular prism 22 that is to be positioned within metal base 1 serves as an internal electrode, while an outer surface 2o exposed to a lower side of metal base 1 serves as an external electrode. When the quartz piece electrode to be mounted into metal base 1 is of a type that has two terminals each arranged on either side, i.e. a both ends supported type, metal lead 2 having two leads protruding from opposing sides may be adopted, as shown in FIG. 14.

The other parts are the same as those in the first embodiment, including the manufacturing method, so that description thereof will not be repeated.

Third Embodiment

Figure 8:
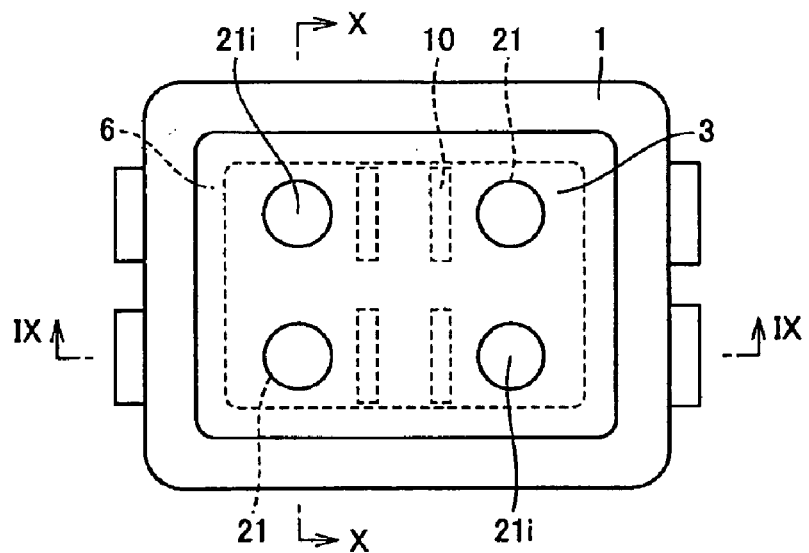
FIG. 8 is a plan view of a thin metal package of a surface mounting type in the second embodiment of the present invention.
Figure 9:
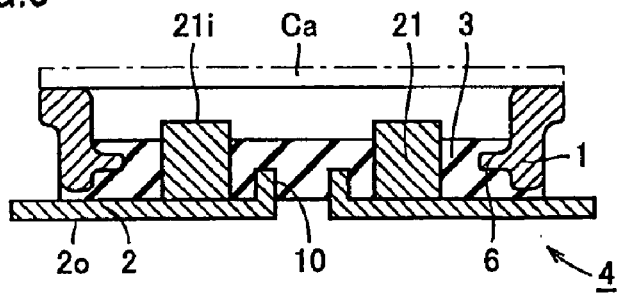
FIG. 9 is a section view taken along line IX—IX in FIG. 8 in the direction of the arrow.
Figure 10:
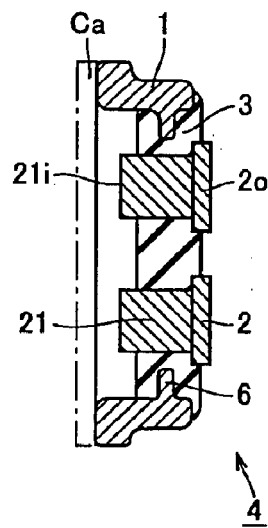
FIG. 10 is a section view taken along line X—X in FIG. 8 in the direction of the arrow.
Figure 15:
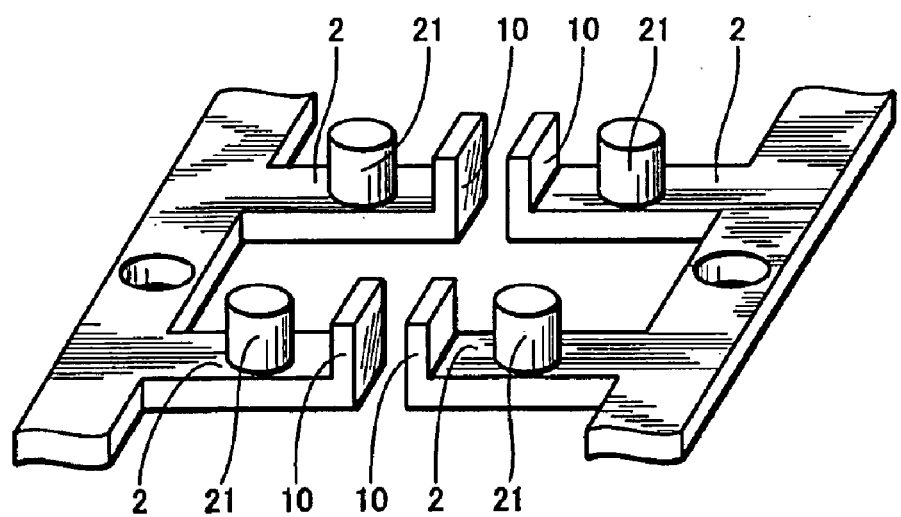
FIG. 15 is a perspective view showing an example of a metal lead applicable to a thin metal package of a surface mounting type in the third embodiment of the present invention.
Figure 16:
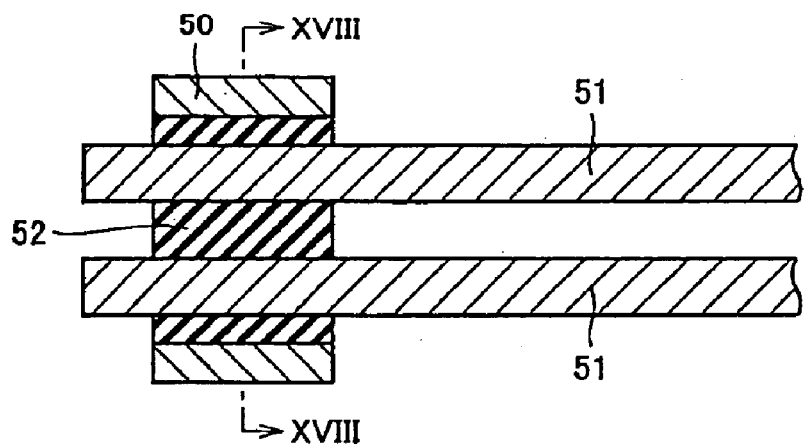
FIG. 16 is a section view showing the metal package in Conventional Example 1 of the surface mounting package.
Figure 17:
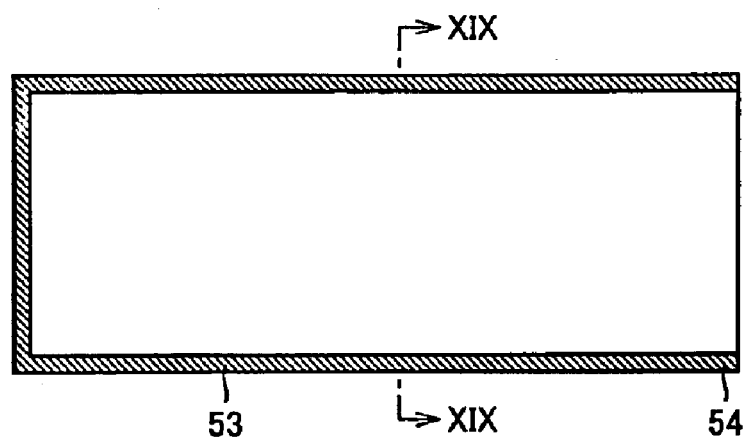
FIG. 17 is a section view taken along the direction of axis of a cylindrical cap for the metal package in Conventional Example 1 of the surface mounting package.
Figure 18:
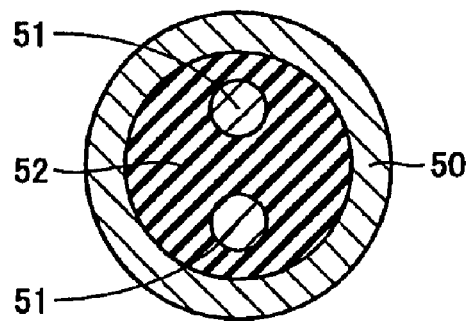
FIG. 18 is a section view taken along line XVIII—XVIII in FIG. 16 showing the metal package in Conventional Example 1 of the surface mounting package.
Figure 19:
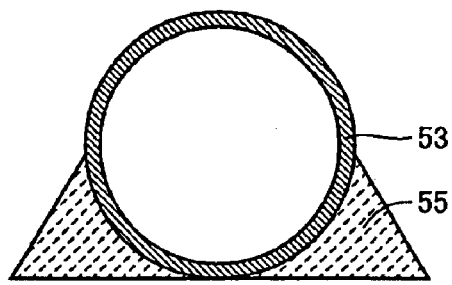
FIG. 19 is a section view taken along line XIX—XIX in FIG. 17 showing the metal package in Conventional Example 1 of the surface mounting package.
Figure 20:
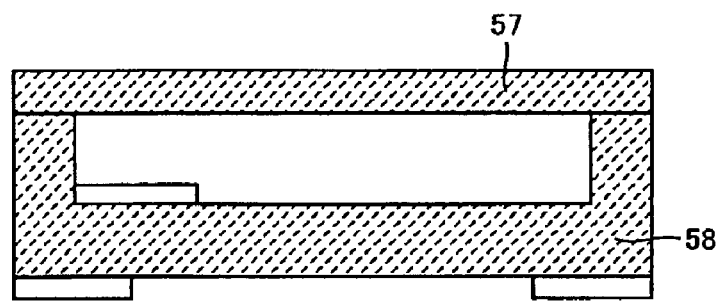
FIG. 20 is a section view of the ceramic package in Conventional Example 2 of the surface mounting package.
Figure 21:
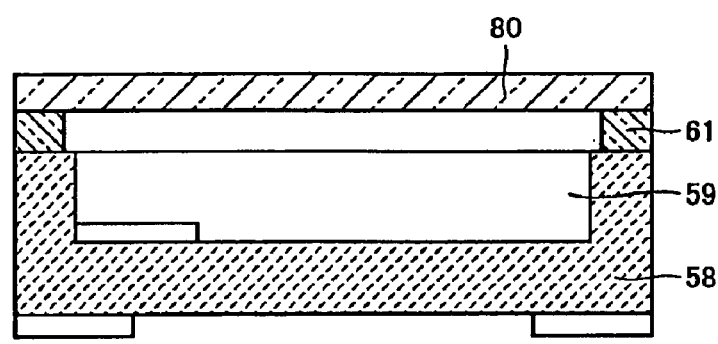
FIG. 21 is a section view of the ceramic package in Conventional Example 3 of the surface mounting package.
Figure 22:
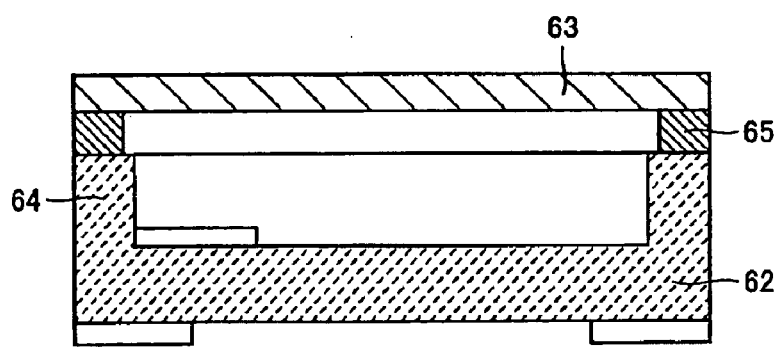
FIG. 22 is a section view showing the package in Conventional Example 4 of the surface mounting package formed by combining a metal cap with a ceramic base.

A surface mounting package for quartz resonator according to the third embodiment of the present invention will be described with reference to FIGS. 8 to 10. The surface mounting package for quartz resonator is a thin metal package of a surface mounting type, constituted by assembled base 4 in which metal base 1 and metal lead 2 are adhered together by melting and solidifying insulating material 3, and metal cap Ca illustrated by a chain double-dashed line (see FIG. 2). Metal lead 2 used in assembled base 4 has a structure as shown in FIG. 15. That is, a pair of opposing flat metal plates is each provided with two branch portions protruding as metal leads 2, and quadrangular prism 21 is connected in the midstream of each of the total four metal leads 2, protruding in the same direction (upward in FIG. 15). This can support two sets of quartz pieces. The other parts are also the same as those in the first embodiments, including the manufacturing method, so that description thereof will not be repeated.

As can be understood from the description above, according to the thin metal package of the surface mounting type as claimed in the present invention, the height of a base, which conventionally could not be lowered because of air tightness required in the press sealing employed in the conventional metal package (Conventional Example 1), can be lowered by changing the sealing method. This allows the package to be thinner and smaller. Moreover, according to the present invention, the base material is changed from ceramic to metal, and the attaching surface at a lower part of the metal base is formed by a metal lead made from a lead frame, conveniently allowing mass production and facilitating assembly work without deterioration of air tightness. As a result, a thin metal package of a surface mounting type can be provided at a low cost.

Industrial Applicability

The present invention may be applicable to a surface mounting package used in surface mounting of an electronic part component such as a quartz resonator, a filter, an oscillator and the like, and is useful in further thinning of the surface mounting package.

What is claimed is:

1. A surface mounting package, comprising:
   a metal base being a metal frame structure with a lower surface having a through hole;
   a metal lead arranged to be inserted into said through hole;
   an insulating material arranged at an internal space of said metal base;
   a cap covering said metal base as a lid; and
   an electronic part component arranged at a surface of said metal lead that is positioned at the internal space of said metal base,
   said internal space being held at an air-tight atmosphere, said metal lead forming a surface for attaching said metal base to a mounting board, an insulation distance between said metal lead and said metal base being at least 0.05 mm and at most 0.3 mm.

2. The surface mounting package according to claim 1, comprising a plurality of said metal leads protruding from said insulating material.

3. The surface mounting package according to claim 1, comprising a protrusion digging into said insulating material on an inner surface of said metal base.

4. A manufacturing method of surface mounting packages,
   each of said surface mounting packages including
   a metal base with a lower surface having a through hole,
   a metal lead arranged to be inserted into said through hole,
   an insulating material arranged at an internal space of said metal base,
   a cap covering said metal base as a lid, and
   an electronic part component arranged at a surface of said metal lead that is positioned at the internal space of said metal base,
   said internal space being held at an air-tight atmosphere, said metal lead forming a surface for attaching said metal base to a mounting board, an insulation distance between said metal lead and said metal base being at least 0.05 mm and at most 0.3 mm,
   said manufacturing method comprising the steps of:
   preparing a lead frame having a plurality of branch portions each to be said metal lead;
   connecting said metal lead to said metal base by inserting each of said plurality of branch portions into said metal base and by melting and solidifying an insulating material; and
   cutting said branch portions to obtain individual metal packages.

* * * * *